(12) United States Patent
Zanbaghi et al.

(10) Patent No.: US 10,720,888 B2
(45) Date of Patent: *Jul. 21, 2020

(54) SYSTEMS AND METHODS FOR DYNAMIC RANGE ENHANCEMENT USING AN OPEN-LOOP MODULATOR IN PARALLEL WITH A CLOSED-LOOP MODULATOR

(71) Applicant: Cirrus Logic, Inc., Austin, TX (US)

(72) Inventors: Ramin Zanbaghi, Austin, TX (US);
Aaron J. Brennan, Austin, TX (US);
John L. Melanson, Austin, TX (US);
Mikel Ash, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/336,995

(22) Filed: Oct. 28, 2016

(65) Prior Publication Data
US 2017/0047895 A1  Feb. 16, 2017

Related U.S. Application Data

(63) Continuation of application No. 14/524,867, filed on Oct. 27, 2014, now Pat. No. 9,503,027.

(51) Int. Cl.
*H03F 3/185* (2006.01)
*H03F 3/217* (2006.01)
(Continued)

(52) U.S. Cl.
CPC ........... *H03F 1/0277* (2013.01); *H03F 1/305* (2013.01); *H03F 3/185* (2013.01); *H03F 3/2171* (2013.01);
(Continued)

(58) Field of Classification Search
CPC .... H03F 1/0205; H03F 1/3205; H03F 1/3223; H03F 1/342; H03F 3/183; H03F 3/185;
(Continued)

(56) References Cited

U.S. PATENT DOCUMENTS 4,446,440 A   5/1984   Bell
4,493,091 A   1/1985   Gundry
(Continued)

FOREIGN PATENT DOCUMENTS

EP   0966105 A2   12/1999
EP   1575164 A2    9/2005
(Continued)

OTHER PUBLICATIONS

International Search Report and Written Opinion of the International Searching Authority, International Application No. PCT/US2016/065134, dated Mar. 15, 2017.
(Continued)

*Primary Examiner* — Levi Gannon
(74) *Attorney, Agent, or Firm* — Jackson Walker L.L.P.

(57) ABSTRACT

An integrated circuit may have two signal paths: an open-loop modulator (which may comprise a digital-input Class-D amplifier) and a closed-loop modulator (which may comprise an analog-input Class-D amplifier). A control subsystem may be capable of selecting either of the open-loop modulator or the closed-loop modulator as a selected path based on one or more characteristics (e.g., signal magnitude) of an input audio signal. For example, for higher-magnitude signals, the closed-loop modulator may be selected while the open-loop modulator may be selected for lower-magnitude signals. In some instances, when the open-loop modulator is selected as the selected path, the closed-loop modulator may power off, which may reduce power consumption. In addition, one or more techniques may be applied to reduce or eliminate user-perceptible audio artifacts caused by switching between the open-loop modulator and the closed-loop modulator, and vice versa.

42 Claims, 7 Drawing Sheets

(51) Int. Cl.
  *H03K 7/08* (2006.01)
  *H03F 1/02* (2006.01)
  *H03F 1/30* (2006.01)

(52) U.S. Cl.
  CPC .............. *H03F 3/2175* (2013.01); *H03K 7/08* (2013.01); *H03F 2200/03* (2013.01); *H03F 2200/129* (2013.01); *H03F 2200/321* (2013.01); *H03F 2200/324* (2013.01); *H03F 2200/351* (2013.01); *H03F 2200/432* (2013.01)

(58) Field of Classification Search
  CPC ........ H03F 3/187; H03F 3/217; H03F 3/2171; H03F 3/2175; H03F 3/2178; H03F 2200/03; H03F 2200/129; H03F 2200/324; H03K 5/04; H03K 7/08
  USPC ...................... 330/207 A, 251; 332/109, 110
  See application file for complete search history.

(56) References Cited

U.S. PATENT DOCUMENTS

| | | | |
|---|---|---|---|
| 4,890,107 A | 12/1989 | Pearce |
| 4,972,436 A | 11/1990 | Halim et al. |
| 4,999,628 A | 3/1991 | Kakaubo et al. |
| 4,999,830 A | 3/1991 | Agazzi |
| 5,077,539 A | 12/1991 | Howatt |
| 5,148,167 A | 9/1992 | Ribner |
| 5,198,814 A | 3/1993 | Ogawara et al. |
| 5,321,758 A | 6/1994 | Charpentier et al. |
| 5,323,159 A | 6/1994 | Imamura et al. |
| 5,343,161 A | 8/1994 | Tokumo et al. |
| 5,550,923 A | 7/1996 | Hotvet et al. |
| 5,600,317 A | 2/1997 | Knoth et al. |
| 5,714,956 A | 2/1998 | Jahne et al. |
| 5,719,641 A | 2/1998 | Mizoguchi |
| 5,808,575 A | 9/1998 | Himeno et al. |
| 5,810,477 A | 9/1998 | Abraham et al. |
| 6,088,461 A | 7/2000 | Lin |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,683,494 B2 | 1/2004 | Stanley |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 | 10/2007 | Bolz et al. |
| 7,302,354 B2 | 11/2007 | Zhuge |
| 7,312,734 B2 | 12/2007 | McNeill et al. |
| 7,315,204 B2 | 1/2008 | Seven |
| 7,365,664 B2 | 4/2008 | Caduff et al. |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,893,856 B2 | 2/2011 | Ek et al. |
| 8,060,663 B2 | 11/2011 | Murray et al. |
| 8,130,126 B2 | 3/2012 | Breitschaedel et al. |
| 8,298,425 B2 | 10/2012 | Kanbe |
| 8,330,631 B2 | 12/2012 | Kumar et al. |
| 8,362,936 B2 | 1/2013 | Ledzius et al. |
| 8,483,753 B2 | 7/2013 | Behzad et al. |
| 8,508,397 B2 | 8/2013 | Hisch |
| 8,717,211 B2 | 5/2014 | Miao et al. |
| 8,786,477 B1 | 7/2014 | Albinet |
| 8,836,551 B2 | 9/2014 | Nozaki |
| 8,873,182 B2 | 10/2014 | Liao et al. |
| 8,878,708 B1 | 11/2014 | Sanders et al. |
| 8,952,837 B2 | 2/2015 | Kim et al. |
| 9,071,267 B1 | 6/2015 | Schneider et al. |
| 9,071,268 B1 | 6/2015 | Schneider et al. |
| 9,118,401 B1 | 8/2015 | Nieto et al. |
| 9,148,164 B1 | 9/2015 | Schneider et al. |
| 9,171,552 B1 | 10/2015 | Yang |
| 9,210,506 B1 | 12/2015 | Nawfal et al. |
| 9,305,658 B2 | 4/2016 | Das et al. |
| 9,337,795 B2 | 5/2016 | Das et al. |
| 9,391,576 B1 | 7/2016 | Satoskar et al. |
| 9,525,940 B1 | 12/2016 | Schneider et al. |
| 9,543,975 B1 | 1/2017 | Melanson et al. |
| 9,596,537 B2 | 3/2017 | He et al. |
| 9,635,310 B2 | 4/2017 | Chang et al. |
| 2001/0001547 A1 | 5/2001 | Delano et al. |
| 2001/0009565 A1 | 7/2001 | Singvall |
| 2004/0078200 A1 | 4/2004 | Alves |
| 2004/0184621 A1 | 9/2004 | Andersen et al. |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1 | 3/2006 | Shalon et al. |
| 2006/0098827 A1 | 5/2006 | Paddock et al. |
| 2006/0284675 A1 | 12/2006 | Krochmal et al. |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2008/0030577 A1 | 2/2008 | Cleary et al. |
| 2008/0114239 A1 | 5/2008 | Randall et al. |
| 2008/0143436 A1 | 6/2008 | Xu |
| 2008/0159444 A1 | 7/2008 | Terada |
| 2008/0198048 A1 | 8/2008 | Klein et al. |
| 2008/0292107 A1 | 11/2008 | Bizjak |
| 2009/0021643 A1 | 1/2009 | Hsueh et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1 | 8/2011 | Anderson et al. |
| 2011/0228952 A1 | 9/2011 | Lin |
| 2011/0242614 A1 | 10/2011 | Okada |
| 2011/0268301 A1 | 11/2011 | Nielsen et al. |
| 2011/0285463 A1 | 11/2011 | Walker et al. |
| 2012/0001786 A1 | 1/2012 | Hisch |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0280726 A1 | 11/2012 | Colombo et al. |
| 2013/0095870 A1 | 4/2013 | Phillips et al. |
| 2013/0106635 A1 | 5/2013 | Doi |
| 2013/0129117 A1 | 5/2013 | Thomsen et al. |
| 2013/0188808 A1 | 7/2013 | Pereira et al. |
| 2013/0241753 A1 | 9/2013 | Nozaki |
| 2013/0241755 A1 | 9/2013 | Chen et al. |
| 2014/0044280 A1 | 2/2014 | Jiang |
| 2014/0105256 A1 | 4/2014 | Hanevich et al. |
| 2014/0105273 A1 | 4/2014 | Chen et al. |

(56) References Cited

U.S. PATENT DOCUMENTS

| | | |
|---|---|---|
| 2014/0126747 A1 | 5/2014 | Huang |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2014/0368364 A1 | 12/2014 | Hsu |
| 2015/0009079 A1 | 1/2015 | Bojer |
| 2015/0170663 A1 | 6/2015 | Disch et al. |
| 2015/0214974 A1 | 7/2015 | Currivan |
| 2015/0214975 A1 | 7/2015 | Gomez et al. |
| 2015/0249466 A1 | 9/2015 | Elyada |
| 2015/0295584 A1 | 10/2015 | Das et al. |
| 2015/0381130 A1 | 12/2015 | Das et al. |
| 2016/0072465 A1 | 3/2016 | Das et al. |
| 2016/0080862 A1 | 3/2016 | He et al. |
| 2016/0080865 A1 | 3/2016 | He et al. |
| 2016/0173112 A1 | 6/2016 | Das et al. |
| 2016/0286310 A1 | 9/2016 | Das et al. |
| 2016/0365081 A1 | 12/2016 | Satoskar et al. |
| 2017/0150257 A1 | 5/2017 | Das et al. |
| 2017/0212721 A1 | 7/2017 | Satoskar et al. |

FOREIGN PATENT DOCUMENTS

| | | |
|---|---|---|
| EP | 1753130 A1 | 2/2007 |
| EP | 1798852 A | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| GB | 2527677 B | 10/2016 |
| GB | 2539517 A | 12/2016 |
| JP | 2008294803 A | 12/2008 |
| WO | WO0054403 A1 | 9/2000 |
| WO | 02/37686 A2 | 5/2002 |
| WO | 2008067260 A1 | 6/2008 |
| WO | 2014113471 A1 | 7/2014 |
| WO | 2015160655 A1 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |

OTHER PUBLICATIONS

International Search Report and Written Opinion of the International Searching Authority, International Application No. PCT/US2016/040096, dated Mar. 24, 2017.
International Search Report and Written Opinion of the International Searching Authority, International Application No. PCT/US2017/014240, dated Apr. 24, 2017.
Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.
Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.
Thaden, Rainer et al., A Loudspeaker Management System with FIR/IRR Filtering; AES 32nd International Conference, Hillerod, Denmark, Sep. 21-23, 2007; pp. 1-12.
Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio. pdf; 23 pages.
GB Patent Application No. 1419651.3, Improved Analogue-to-Digital Convertor, filed Nov. 4, 2014, 65 pages.
Combined Search and Examination Report, GB Application No. GB1506258.1, dated Oct. 21, 2015, 6 pages.
International Search Report and Written Opinion, International Patent Application No. PCT/US2015/025329, dated Aug. 11, 2015, 9 pages.
International Search Report and Written Opinion, International Patent Application No. PCT/US2015/048633, dated Dec. 10, 2015, 11 pages.
International Search Report and Written Opinion, International Patent Application No. PCT/US2015/048591, dated Dec. 10, 2015, 11 pages.
Combined Search and Examination Report, GB Application No. GB1510578.6, dated Aug. 3, 2015, 3 pages.
International Search Report and Written Opinion, International Application No. PCT/US2015/056357, dated Jan. 29, 2015, 13 pages.
Combined Search and Examination Report, GB Application No. GB1514512.1, dated Feb. 11, 2016, 7 pages.
International Search Report and Written Opinion, International Application No. PCT/US2015/048609, dated Mar. 23, 2016, 23 pages.
International Search Report and Written Opinion, International Application No. PCT/US2016/022578, dated Jun. 22, 2016, 12 pages.
Combined Search and Examination Report, GB Application No. GB1600528.2, dated Jul. 7, 2016, 8 pages.
Combined Search and Examination Report, GB Application No. GB1603628.7, dated Aug. 24, 2016, 6 pages.
International Search Report and Written Opinion, International Application No. PCT/EP2016/062862, dated Aug. 26, 2016, 14 pages.
Combined Search and Examination Report, GB Application No. GB1602288.1, dated Aug. 9, 2016, 6 pages.
Combined Search and Examination Report under Sections 17 and 18(3) of the UKIPO, Application No. GB1620427.3, dated Jun. 1, 2017.
Combined Search and Examination Report under Sections 17 and 18(3) of the UKIPO, Application No. GB1620428.1, dated Jul. 21, 2017.
Combined Search and Examination Report under Sections 17 and 18(3), United Kingdom Intellectual Property Office, Application No. GB1700371.6, dated Aug. 1, 2017.

SYSTEMS AND METHODS FOR DYNAMIC RANGE ENHANCEMENT USING AN OPEN-LOOP MODULATOR IN PARALLEL WITH A CLOSED-LOOP MODULATOR

This application is a continuation of U.S. Non-Provisional application Ser. No. 14/524,867 filed on Oct. 27, 2014, which is incorporated by reference herein in its entirety.

RELATED APPLICATIONS

The present disclosure is related to co-pending U.S. patent application Ser. No. 14/467,969, filed Aug. 25, 2014 and entitled "Reducing Audio Artifacts in a System for Enhancing Dynamic Range of Audio Signal Path," U.S. patent application Ser. No. 14/483,659, filed Sep. 11, 2014, now U.S. Pat. No. 9,596,537 and entitled "Systems and Methods for Reduction of Audio Artifacts in an Audio System with Dynamic Range Enhancement," and U.S. patent application Ser. No. 14/481,201, filed Sep. 9, 2014, now U.S. Pat. No. 9,337,795 and entitled "Systems and Methods for Gain Calibration of an Audio Signal Path," each of which are incorporated herein by reference.

FIELD OF DISCLOSURE

The present disclosure relates in general to circuits for audio devices, including without limitation personal audio devices such as wireless telephones and media players, and more specifically, to systems and methods for enhancing a dynamic range of an audio signal path in an audio device while reducing the existence of audio artifacts when switching between dynamic range enhancement modes.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device which may affect its marketability and desirability is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of amplifier μl, such that any increased dynamic range as a result of a high-gain amplifier may be offset by signal noise which may effectively mask lower-intensity audio signals. Accordingly, approaches are desired which allow for high dynamic range while reducing signal noise for lower-intensity audio signals.

SUMMARY

In accordance with the teachings of the present disclosure, one or more disadvantages and problems associated with existing approaches to maintaining a high dynamic range of an audio signal path may be reduced or eliminated.

In accordance with embodiments of the present disclosure, a system may include an open-loop modulator, a closed-loop modulator, and a control subsystem. The open-loop modulator may be configured to receive an input signal and generate an output signal based on the input signal when the open-loop modulator is selected as a selected path. The closed-loop modulator may be configured to receive the input signal and generate a closed-loop output signal based on the input signal when the closed-loop modulator is selected as the selected path. The control subsystem may be configured to select one of the open-loop modulator and the closed-loop modulator as the selected path based on one or more characteristics of the input signal.

In accordance with these and other embodiments of the present disclosure, a method may include selecting one of an open-loop modulator and a closed-loop modulator based on one or more characteristics of an input signal. The method may also include generating an output signal based on the input signal by the open-loop modulator when the open-loop modulator is selected as a selected path. The method may further include generating an output signal based on the input signal by the closed-loop modulator when the closed-loop modulator is selected as a selected path.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may have two parallel signal paths: an open-loop Class-D modulator (which may comprise a digital-input Class-D amplifier) and a closed-loop Class-D modulator (which may comprise an analog-input Class-D amplifier). A control subsystem may be capable of selecting either of the open-loop Class-D modulator or the closed-loop Class-D modulator as a selected path based on one or more characteristics (e.g., signal magnitude) of an input audio signal. For example, for higher-magnitude signals, the closed-loop Class-D modulator may be selected while the open-loop Class-D modulator may be selected for lower-magnitude signals. In some instances, when the open-loop Class-D modulator is selected as the selected path, the closed-loop Class-D modulator may power off, which may reduce power consumption. In addition, one or more techniques may be applied to reduce or eliminate user-perceptible audio artifacts caused by switching between the open-loop Class-D modulator and the closed-loop Class-D modulator, and vice versa.

Figure 1:
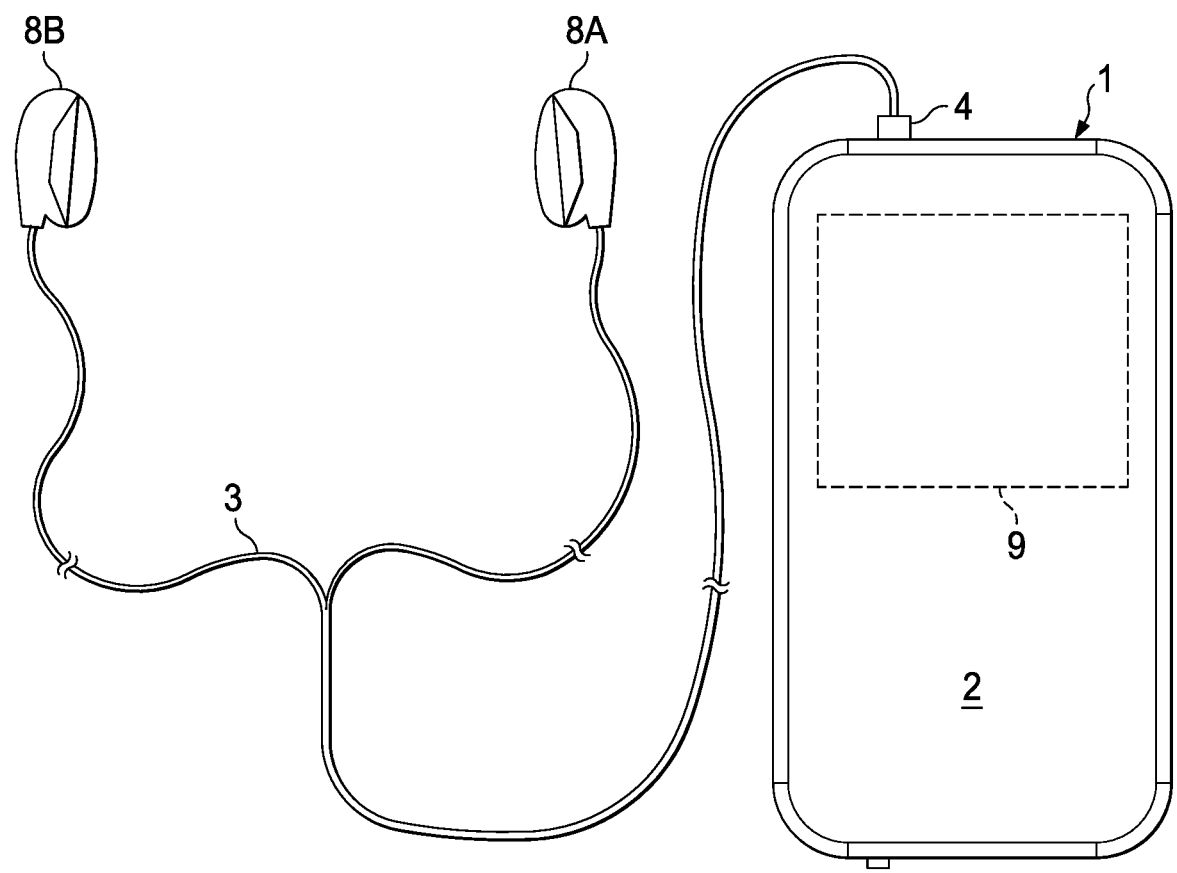
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
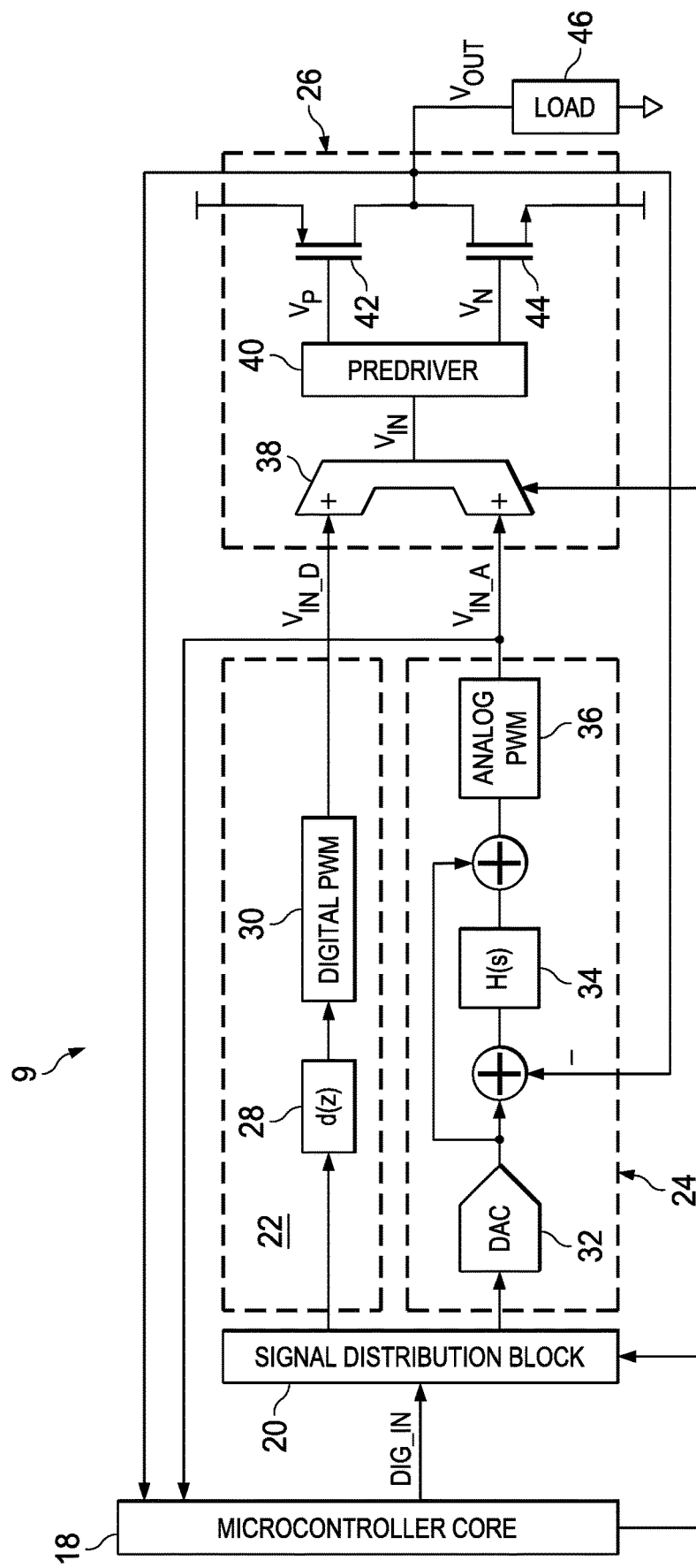
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a signal distribution block 20. Signal distribution block 20 may, based on one or more characteristics (e.g., including but not limited to signal magnitude) of digital audio input signal DIG_IN, communicate digital audio input signal DIG_IN (or a signal similar thereto) to one or both of open-loop modulator 22 or closed-loop modulator 24 which is in parallel with open-loop modulator 22. For example, if the signal magnitude of digital audio input signal DIG_IN is below a threshold magnitude level, signal distribution block 20 may deliver digital audio input signal DIG_IN (or a signal similar thereto) to open-loop modulator 22 but not closed-loop modulator 24. By withholding a signal from closed-loop modulator 24, closed-loop modulator 24 may effectively be powered down or otherwise consume less energy than if a signal was delivered to closed-loop modulator 24. As another example, if the signal magnitude of digital audio input signal DIG_IN is above a threshold magnitude level, signal distribution block 20 may deliver digital audio input signal DIG_IN (or a signal similar thereto) to closed-loop modulator 24. In some embodiments, signal distribution block 20 may withhold delivery of a signal to open-loop modulator 22 when digital audio input signal DIG_IN is above a threshold magnitude level, while in other embodiments, signal distribution block 20 may deliver digital audio input signal DIG_IN (or a signal similar thereto) to open-loop modulator 22 regardless of the signal magnitude of digital audio input signal DIG_IN, as the power consumption of open-loop modulator 22 may be such that reduction in such power consumption may be minimal.

As shown in FIG. 2, open-loop modulator 22 may include a digital equalization filter 28 having response d(z) and a digital pulse-width modulation (PWM) signal generator 30. The response d(z) of digital equalization filter 28 may be selected as to match a transfer function of open-loop modulator 22 to a transfer function of closed-loop modulator 24. In some embodiments, response d(z) may be tuned or calibrated so as to ensure matching of the transfer functions of open-loop modulator 22 and closed-loop modulator 24, as described in greater detail below in reference to FIG. 7. Digital PWM signal generator 30 may include any system, device, or apparatus configured to generate a periodic signal $V_{IN\_D}$ having a pulse width which is a function of the magnitude of digital audio input signal DIG_IN as filtered by digital equalization filter 28. For example, the pulse width of periodic signal $V_{IN\_D}$ may increase as the magnitude of digital audio input signal DIG_IN increases, and vice versa.

As depicted in FIG. 2, closed-loop modulator 24 may include a digital-to-analog converter (DAC) 32, a low-pass filter 34 having a response H(s), and an analog PWM signal generator 36. DAC 32 may receive digital audio input signal DIG_IN (or a signal similar thereto) and convert it to an analog input signal. The analog input signal may be combined with an inverse of periodic signal $V_{IN\_A}$ generated by analog PWM signal generator 36 to generate an error signal which is communicated to low-pass filter 34. Low-pass filter 34 may have a response H(s) to reduce or shape non-linearities of the analog signal caused by one or more components of audio IC 9, in order to reduce the error present in closed-loop modulator 24.

The filtered error signal may be combined with the analog input signal to generate an error-corrected analog input signal that is communicated to analog PWM signal generator 36. Such direct analog feed forward of the analog input signal may provide for relatively fast and memory-less switching when selection is switched from open-loop modulator 22 to closed-loop modulator 24, thus potentially reducing the occurrence of user-perceptible audio artifacts.

Analog PWM signal generator 36 may include any system, device, or apparatus configured to generate a periodic signal $V_{IN\_A}$ having a pulse width which is a function of the magnitude of the error-corrected analog input signal. For example, the pulse width of periodic signal $V_{IN\_A}$ may increase as the magnitude of the error-corrected analog input signal increases, and vice versa.

Common path 26 may include adder/controller 38, pre-driver 40, and a switched output stage comprising a pull-up driver device 42 (which may be implemented as a p-type metal-oxide-semiconductor field effect transistor in the embodiments represented by FIG. 2) coupled at its non-gate terminals between a supply voltage and an output node and a pull-down driver device 44 (which may be implemented as an n-type metal-oxide-semiconductor field effect transistor in the embodiments represented by FIG. 2) coupled at its non-gate terminals between a ground voltage and the output node.

Adder/controller 38 may comprise any system, device, or apparatus configured to add periodic signal $V_{IN\_D}$ output by open-loop modulator 22 to periodic signal $V_{IN\_A}$ output by closed-loop modulator 24 to generate predriver control signal $V_{IN}$. In some embodiments, adder/controller 38 may comprise a select input (e.g., communicated from microcontroller core 18) that may selectively mute one of its inputs (e.g., mute either of periodic signal $V_{IN\_D}$ and periodic signal $V_{IN\_A}$) based on one or more characteristics (e.g., signal magnitude) of digital audio input signal DIG_IN. For example, if the signal magnitude of digital audio input signal DIG_IN is below a threshold magnitude level, adder/controller 38 may mute its input receiving periodic signal $V_{IN\_A}$ from closed-loop modulator 24 such that periodic signal $V_{IN\_D}$ from open-loop modulator 22 passes to the output of adder/controller 38 as predriver control signal $V_{IN}$. As another example, if the signal magnitude of digital audio input signal DIG_IN is above the threshold magnitude level, adder/controller 38 may mute its input receiving periodic signal $V_{IN\_D}$ from open-loop modulator 22 such that periodic signal $V_{IN\_A}$ from closed-loop modulator 24 passes to the output of adder/controller 38 as predriver control signal $V_{IN}$.

Predriver circuitry 40 may comprise any system, device, or apparatus configured to receive predriver control signal $V_{IN}$, which may comprise a pulse-width modulated voltage signal, and apply control logic and/or buffering to such input voltage to drive a pull-up device driving signal voltage $V_P$ to the gate terminal of pull-up driver device 42 and to drive a pull-down device driving signal voltage $V_N$ to the gate terminal of pull-down driver device 44, wherein pull-up device driving signal voltage $V_P$ and pull-down device driving signal voltage $V_N$ are each a function of predriver control signal $V_{IN}$. Based on respective input voltage signals $V_P$ and $V_N$ driven to their respective gates, pull-up driver device 42 and pull-down driver device 44 may drive an output voltage $V_{OUT}$ to load 46 which is a function of the respective input voltage signals. Accordingly, in those embodiments represented by FIG. 2, audio IC 9 may include a digital-input Class-D amplifier comprising open-loop modulator 22 and common path 26 and an analog-input Class-D amplifier comprising closed-loop modulator 24 and common path 26, such that the digital-input Class-D amplifier and the analog-input Class-D amplifier are in parallel with each other and share common path 26 as the switched output stage of each of such Class-D amplifiers.

Load 46 may include any suitable output load. For example, load 46 may include an audio transducer (e.g., a loudspeaker, earbud speakers 8A and 8B, etc.).

As also shown in FIG. 2, microcontroller core 18 may receive feedback from periodic signal $V_{IN\_A}$ and output voltage $V_{OUT}$. Both feedback signals may allow microcontroller core 18 to implement a feedback control loop with audio IC 9. In addition or alternatively, one or both feedback signals may enable mechanisms for reduction of audio artifacts, as described in greater detail below. For example, as shown in greater detail below, feedback of periodic signal $V_{IN\_A}$ may be used to monitor the loop of closed-loop modulator 24 before switching selection of the selected path from open-loop modulator 22 to closed-loop modulator 24.

In operation, for lower magnitudes of digital audio input signal DIG_IN (e.g., below a threshold magnitude), signal distribution block 20 may communicate digital audio input signal DIG_IN (or a signal similar thereto) to open-loop modulator 22 and adder/controller 38 may cause periodic signal $V_{IN\_D}$ to pass to its output as predriver control signal $V_{IN}$. In some embodiments, signal distribution block 20 may withhold a signal from closed-loop modulator 24, which may serve the purpose of powering off or reducing power consumption of closed-loop modulator 24. In some embodiments, adder/controller 38 may mute its input for receiving periodic signal $V_{IN\_A}$, although in embodiments in which signal distribution block 20 withholds a signal from closed-loop modulator 24, such muting may not be required. Use of open-loop modulator 22 in generating predriver control signal $V_{IN}$ for lower magnitudes of digital audio input signal DIG_IN may be preferable as open-loop modulator 22 may have lower distortion and a lower noise floor as compared to closed-loop modulator 24.

On the other hand, for higher magnitudes of digital audio input signal DIG_IN (e.g., above a threshold magnitude), signal distribution block 20 may communicate digital audio input signal DIG_IN (or a signal similar thereto) to closed-loop modulator 24 and adder/controller 38 may cause periodic signal $V_{IN\_A}$ to pass to its output as predriver control signal $V_{IN}$. In some embodiments, signal distribution block 20 may withhold a signal from open-loop modulator 22, although in many embodiments signal distribution block 20 may nonetheless communicate digital audio input signal DIG_IN (or a signal similar thereto) to open-loop modulator 22. In some embodiments, adder/controller 38 may mute its input for receiving periodic signal $V_{IN\_D}$, particularly in those embodiments in which signal distribution block 20 communicates digital audio input signal DIG_IN (or a signal similar thereto) to closed-loop modulator 24. Use of closed-loop modulator 24 in generating predriver control signal $V_{IN}$ for higher magnitudes of digital audio input signal DIG_IN may be preferable as closed-loop modulator 24 may experience less non-linearity (particularly at higher magnitudes) as compared to open-loop modulator 22 and the higher noise floor of closed-loop modulator 24 compared to that of open-loop modulator 22 may be tolerable for higher signal magnitudes.

Such use of open-loop modulator 22 and closed-loop modulator 24 may increase dynamic range of an audio IC over existing approaches, as lower magnitude signals more susceptible to noise may be processed by open-loop modulator 22 which has greater immunity to noise than closed-loop modulator 24 while higher magnitude signals which are not as susceptible to noise may be processed by closed-loop modulator 24 which may have more desirable transfer characteristics (e.g., greater linearity) at higher magnitudes than that of open-loop modulator 22.

Figure 3:
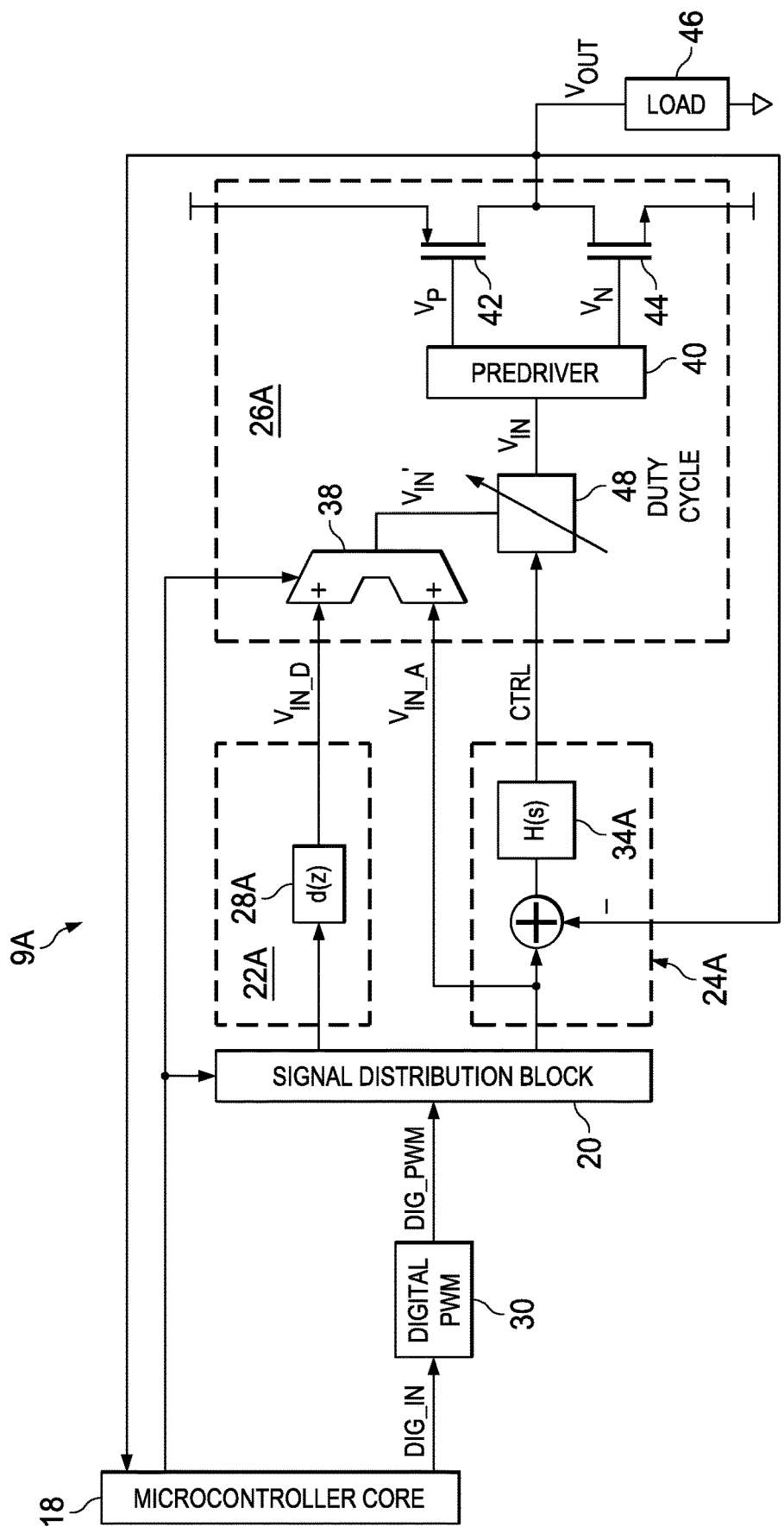
FIG. 3 is a block diagram of selected components of another example audio integrated circuit of a personal audio device, in accordance with embodiments of the present disclosure.

FIG. 3 is a block diagram of selected components of another example audio IC 9A of a personal audio device, in accordance with embodiments of the present disclosure. In many respects, audio IC 9A of FIG. 3 is similar in structure and functionality to audio IC 9 of FIG. 1. Accordingly, in the following description of FIG. 3, only those key differences between audio IC 9A and audio IC 9 are described.

In audio IC 9A, microcontroller core 18 may communicate digital audio input signal DIG_IN to digital PWM signal generator 30, which communicates a pulse-width modulated signal DIG_PWM to signal distribution block 20. Based on one or more characteristics of digital audio input signal DIG_IN (or a signal similar thereto), signal distribution block 20 may communicate pulse-width modulated signal DIG_PWM (or a signal similar thereto) to one or both of open-loop modulator 22A or closed-loop modulator 24A which is in parallel with open-loop modulator 22A. Any signal communicated to closed-loop modulator 24A may also be communicated to an input of adder/controller 38 as periodic signal $V_{IN\_A}$.

As shown in FIG. 3, open-loop modulator 22A may include a digital equalization filter 28A having response d(z). The response d(z) of digital equalization filter 28A may be selected as to match a transfer function of open-loop modulator 22A to a transfer function of closed-loop modulator 24A. In some embodiments, response d(z) may be tuned or calibrated so as to ensure matching of the transfer functions of open-loop modulator 22A and closed-loop modulator 24A. Digital equalization filter 28A may output a periodic signal $V_{IN\_D}$ which is a pulse-modulated signal.

As depicted in FIG. 3, closed-loop modulator 24A may include a low-pass filter 34A having a response H(s). Low-pass filter 34A may have a response H(s) to reduce or shape non-linearities of audio signals caused by one or more components of audio IC 9, in order to reduce the error present in closed-loop modulator 24A and may filter an error equal to the difference between periodic signal $V_{IN\_A}$ and output signal $V_{OUT}$ in order to generate filtered error signal CTRL. In some embodiments, response H(s) may also improve a power-supply rejection ratio for audio IC 9A. Filtered error signal CTRL may represent an accumulated edge error between periodic signal $V_{IN\_A}$ and output signal $V_{OUT}$.

Common path 26A may comprise adder/controller 38 and a variable duty cycle controller 48. Common path 26A may also include a predriver 40, pull-up driver device 42, and pull-down driver device 44 arranged in a manner identical to that of audio IC 9.

Adder/controller 38 may add periodic signal $V_{IN\_D}$ output by open-loop modulator 22A to periodic signal $V_{IN\_A}$ output by closed-loop modulator 24A to generate intermediate predriver control signal $V_{IN}'$. Variable duty cycle controller 48 may adjust the duty cycle of predriver control signal $V_{IN}'$ based on filtered error signal CTRL in order to generate predriver control signal $V_{IN}$, which may be input to predriver 40.

In the topology of audio IC 9A, two channels are used to generate predriver control signal $V_{IN}$. The first channel is that of open-loop modulator 22A, used for lower magnitudes of digital audio input signal DIG_IN signals (e.g., those below a threshold magnitude) in which periodic signal $V_{IN\_D}$ may pass substantially unchanged to the output of variable duty cycle controller 48 as predriver control signal $V_{IN}$. The second channel is that in which periodic signal $V_{IN\_A}$ may pass to the input of variable duty cycle controller 48 and is modified based on filtered error signal CTRL in order to generate predriver control signal $V_{IN}$.

Such use of open-loop modulator 22A and closed-loop modulator 24A may increase dynamic range of an audio IC over existing approaches, as lower magnitude signals more susceptible to noise may be processed by open-loop modulator 22A which has greater immunity to noise than closed-loop modulator 24A while higher magnitude signals which are not as susceptible to noise may be processed by closed-loop modulator 24A which may have more desirable transfer characteristics (e.g., greater linearity) at higher magnitudes than that of open-loop modulator 22A.

Figure 4:
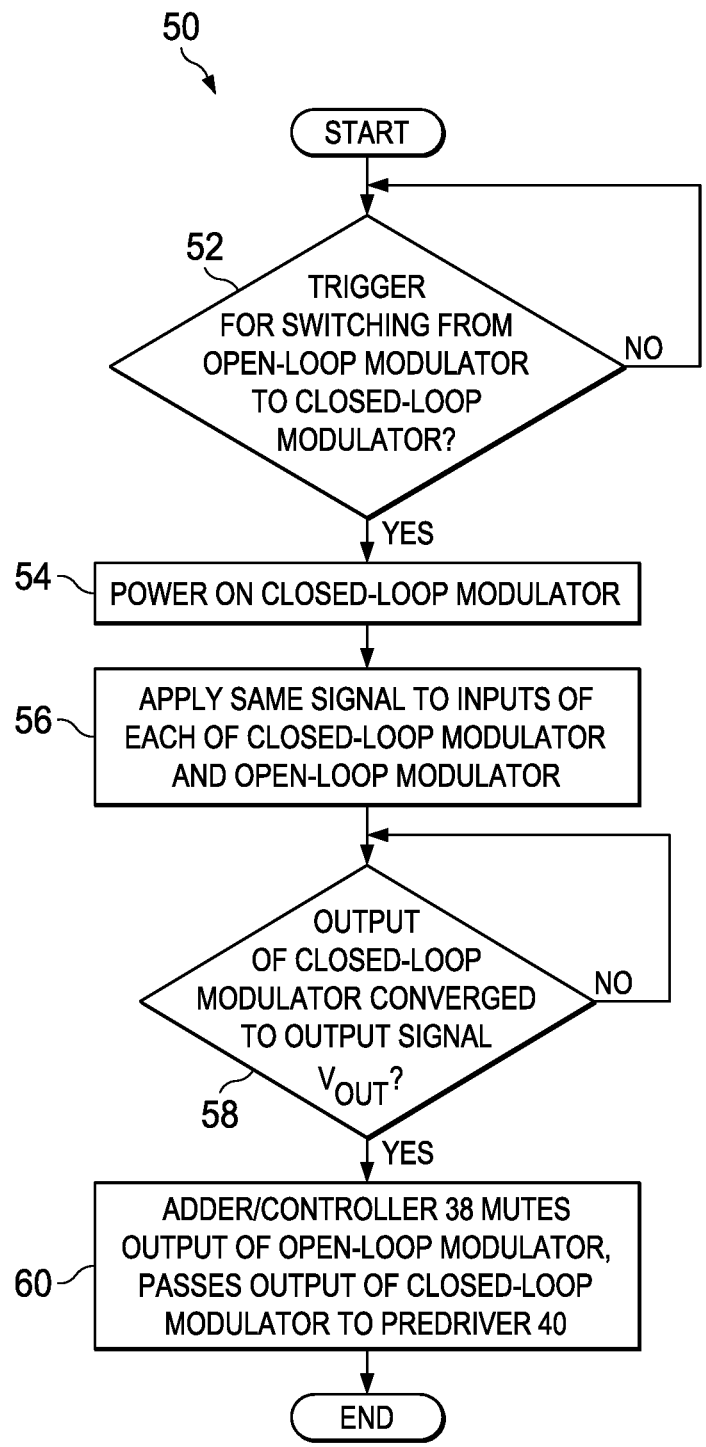
FIG. 4 illustrates a flow chart of an example method for minimizing audio artifacts when an audio integrated circuit transitions its selected path from an open-loop Class-D modulator to a closed-loop Class-D modulator, in accordance with embodiments of the present disclosure.

FIG. 4 illustrates a flow chart of an example method 50 for minimizing audio artifacts when an audio IC (e.g., audio IC 9 or audio IC 9A) transitions its selected path from an open-loop modulator (e.g., open-loop modulator 22 or open-loop modulator 22A) to a closed-loop modulator (e.g., closed-loop modulator 24 or closed-loop modulator 24A), in accordance with embodiments of the present disclosure. Without techniques for minimizing audio artifacts, such audio artifacts may occur when transitioning from an open-loop modulator to a closed-loop modulator in embodiments in which the closed-loop modulator is powered down when not selected, as the feedback of the closed-loop modulator may require time to allow its output to fully converge to that of the open-loop modulator. As noted above, teachings of the present disclosure may be implemented in a variety of configurations of audio ICs as shown in FIGS. 2 and 3. As such, the preferred initialization point for method 50 and the order of the steps comprising method 50 may depend on the implementation chosen. In these and other embodiments, method 50 may be implemented as firmware, software, applications, functions, libraries, or other instructions.

When an open-loop modulator is the selected path (e.g., when a magnitude of digital audio input signal DIG_IN is below a threshold magnitude), its parallel closed-loop modulator may be powered off or powered down, an input signal may be communicated to the open-loop modulator and not the closed-loop modulator, and the output of the open-loop modulator but not the output of the closed-loop modulator may be passed to a switched output stage for driving a load.

At step 52, and while operating with the open-loop modulator as the selected path, microcontroller core 18 may monitor for a trigger for switching the selected path from the open-loop modulator to the closed-loop modulator. Such trigger may include an actual crossing from below to above a threshold magnitude of digital audio input signal DIG_IN, or an indication or prediction that such a threshold crossing is imminent. Once such a trigger occurs, method 50 may proceed to step 54. Otherwise, method 50 may remain at step 52.

At step 54, in response to the trigger, the closed-loop modulator may be powered on, which may include powering on of a low-pass filter (e.g., filter 34 or 34A) of the closed-loop modulator. At step 56, the same input signal may be communicated to both the open-loop modulator and the closed-loop modulator, while adder/controller 38 may continue to mute its input from the closed-loop modulator and pass the output of the open-loop modulator to the switched output stage.

At step 58, microcontroller core 18 may monitor output signal $V_{OUT}$ and the output of the closed-loop modulator (e.g., periodic signal $V_{IN\_A}$), to determine if the output of the closed-loop modulator has converged with output signal $V_{OUT}$, in order to reduce audio artifacts (e.g., audible pops and clicks) from occurring by switching between the open-loop modulator and the closed-loop modulator. Once converged, method 50 may proceed to step 60. Otherwise, method 50 may remain at step 58 until convergence occurs.

At step 60, adder/controller 38 may mute its input from the open-loop modulator, and pass the output of the closed-loop modulator to the switched output stage. After completion of step 60, method 50 may end.

Although FIG. 4 discloses a particular number of steps to be taken with respect to method 50, method 50 may be executed with greater or fewer steps than those depicted in FIG. 4. In addition, although FIG. 4 discloses a certain order of steps to be taken with respect to method 50, the steps comprising method 50 may be completed in any suitable order.

Method 50 may be implemented using microcontroller core 18, components thereof or any other system such as those shown in FIGS. 1-3 and operable to implement method 50. In certain embodiments, method 50 may be implemented partially or fully in software and/or firmware embodied in computer-readable media.

Figure 5:
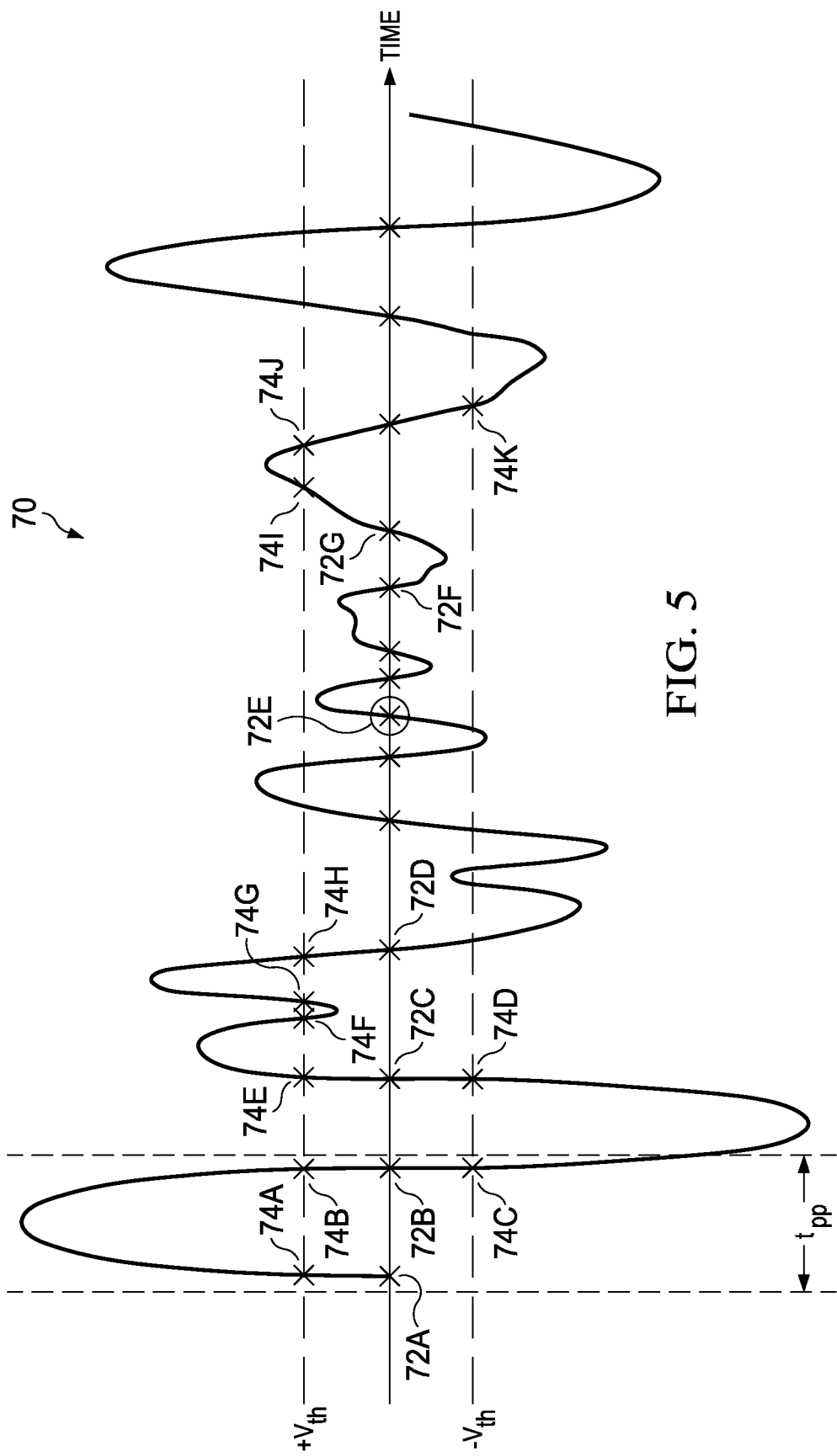
FIG. 5 illustrates an example waveform demonstrating a method for minimizing audio artifacts when an audio integrated circuit transitions its selected path from an open-loop Class-D modulator to a closed-loop Class-D modulator or vice versa, in accordance with embodiments of the present disclosure.

FIG. 5 illustrates an example waveform 70 demonstrating a method for minimizing audio artifacts when an audio integrated circuit transitions its selected path from an open-loop modulator to a closed-loop modulator or vice versa, in accordance with embodiments of the present disclosure. The method demonstrated in FIG. 5 may be suitable for minimizing audio artifacts in applications in which active noise control is not employed in audio IC 9. Example waveform 70 may represent a magnitude of digital audio input signal DIG_IN. As shown in FIG. 5, waveform 70 may experience numerous zero crossings 72 (e.g., 72A-72F) and numerous threshold crossings 74 (e.g., 74A-74H). As used herein, a "zero crossing" of a signal may occur when the waveform of such signal crosses a magnitude of zero or crosses another level within a threshold of zero and indicative of a zero crossing (e.g., a low signal level of lower than −70 dB relative to full-scale magnitude or within a small number of least significant bits of zero).

In operation, at each zero crossing 72, microcontroller core 18 may pre-process audio data that it has received in order to "look ahead" a time duration of $t_{pp}$ to determine if digital audio input signal DIG_IN (or a derivative thereof) crosses above a threshold magnitude (e.g., either above threshold $+V_{th}$ or below threshold $-V_{th}$) within the time duration $t_{pp}$. If microcontroller core 18 determines a threshold crossing 74 occurs within duration $t_{pp}$ after a zero crossing 72, microcontroller core 18 may select a closed-loop modulator as the selected path. Otherwise, if a threshold crossing 74 does not occur within duration $t_{pp}$ after a zero crossing 72, microcontroller core 18 may select an open-loop modulator as the selected path. For example, at zero crossing 72A, microcontroller core 18 may determine that digital audio input signal DIG_IN experiences threshold crossings 74A, 74B, and 74C within duration $t_{pp}$ and thus may select the closed-loop modulator as the selected path (and, if the open-loop modulator was selected prior to zero crossing 72A, switch from the open-loop modulator to the closed-loop modulator as the selected path at zero crossing 72A). As another example, at zero crossing 72C, microcontroller core 18 may determine that digital audio input signal DIG_IN experiences threshold crossings 74E, 74F, 74G, and 74H within duration $t_{pp}$ and thus may maintain selection of the closed-loop modulator as the selected path. Later, at a zero crossing 72E, microcontroller core 18 may determine that digital audio input signal DIG_IN experiences no threshold crossings within duration $t_{pp}$ and thus may switch selection of the selected path from the closed-loop modulator to the open-loop modulator. Subsequently, at zero crossing 72G, microcontroller core 18 may determine that digital audio input signal DIG_IN experiences threshold crossings 74I, 74J, and 74K within duration $t_{pp}$ and thus may switch selection of the selected path from the open-loop modulator to the closed-loop modulator.

In certain applications, such as audio ICs utilizing active noise cancellation, pre-processing as described above may not be desirable as the signal time delay imposed by such pre-processing may not be tolerable by the active noise cancellation circuitry. Thus, in some embodiments, rather than determine at zero crossings 72 whether to switch between selected paths, microcontroller core 18 may instead switch the selected path between the open-loop modulator and the closed-loop modulator at threshold crossings 74. Thus, at signal levels between $-V_{th}$ and $+V_{th}$, microcontroller core 18 may select the open-loop modulator as the selected path, and may otherwise select the closed-loop modulator as the selected path.

Figure 6:
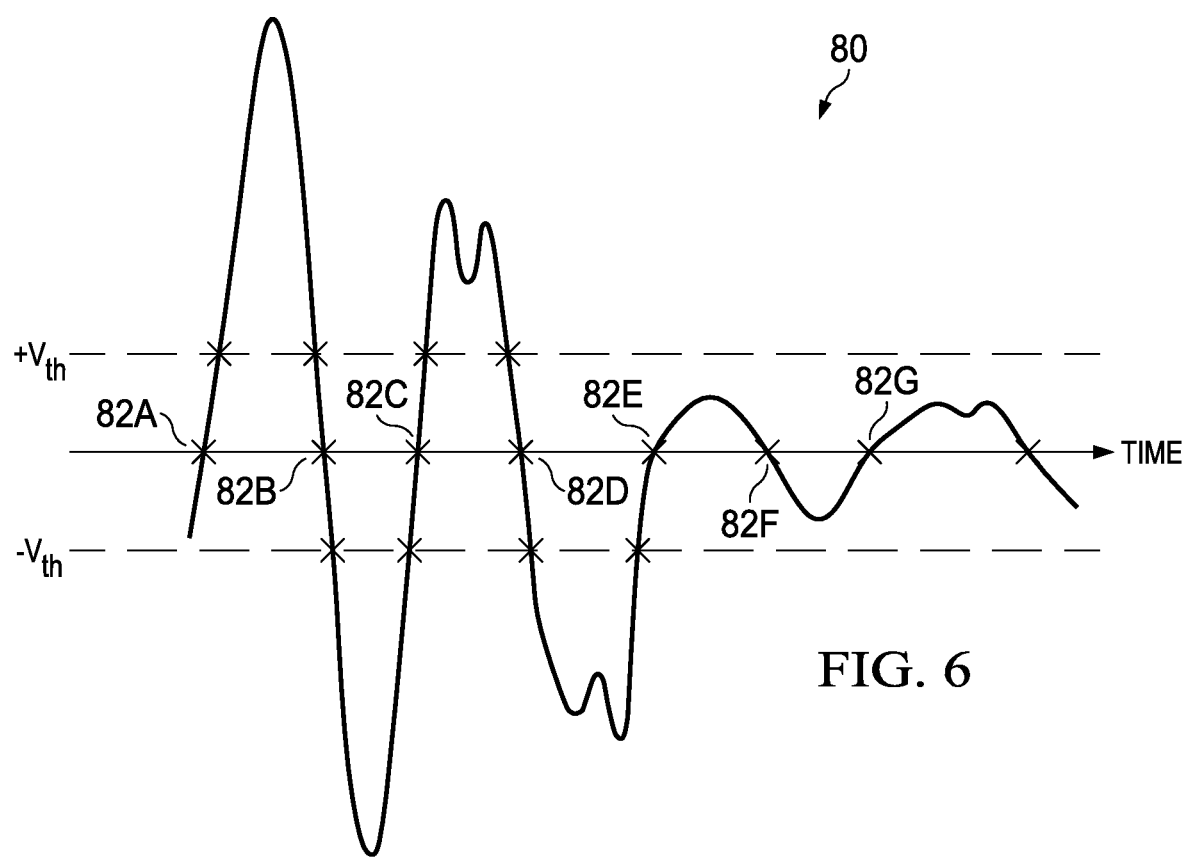
FIG. 6 illustrates an example waveform demonstrating another method for minimizing audio artifacts when an audio integrated circuit transitions its selected path from an open-loop Class-D modulator to a closed-loop Class-D modulator or vice versa, in accordance with embodiments of the present disclosure.

FIG. 6 illustrates an example waveform 80 demonstrating a method for minimizing audio artifacts when an audio integrated circuit transitions its selected path from an open-loop modulator to a closed-loop modulator or vice versa, in accordance with embodiments of the present disclosure. Example waveform 80 may represent a magnitude of digital audio input signal DIG_IN. As shown in FIG. 6, waveform 80 may experience numerous zero crossings 82 (e.g., 82A-82G). In operation, at each zero crossing 82, microcontroller core 18 may determine a slew rate (e.g., slope of magnitude versus time) of waveform 80. A slew rate having an absolute value above a threshold slew rate may indicate that waveform 80 is likely to cross a magnitude threshold (e.g., $-V_{th}$ or $+V_{th}$) before the next zero crossing 82, while a slew rate having an absolute value below the threshold slew rate may indicate that waveform 80 is not likely to cross a magnitude threshold before the next zero crossing 82. Accordingly, at each zero crossing 82, microcontroller core 18 may select the closed-loop modulator as the selected path if the absolute value of the slew rate at the zero crossing 82 is above the threshold slew rate, and may select the open-loop modulator as the selected path if the absolute value of the slew rate at the zero crossing 82 is below the threshold slew rate. For example, at zero crossings 82A-82D, the absolute value of the slew rates may exceed the threshold slew rate, and microcontroller core 18 may select the closed-loop modulator as the selected path. On the other hand, at zero crossings 82E-82G, the absolute value of the slew rates may be lesser than the threshold slew rate, and microcontroller core 18 may select the open-loop modulator as the selected path.

Figure 7:
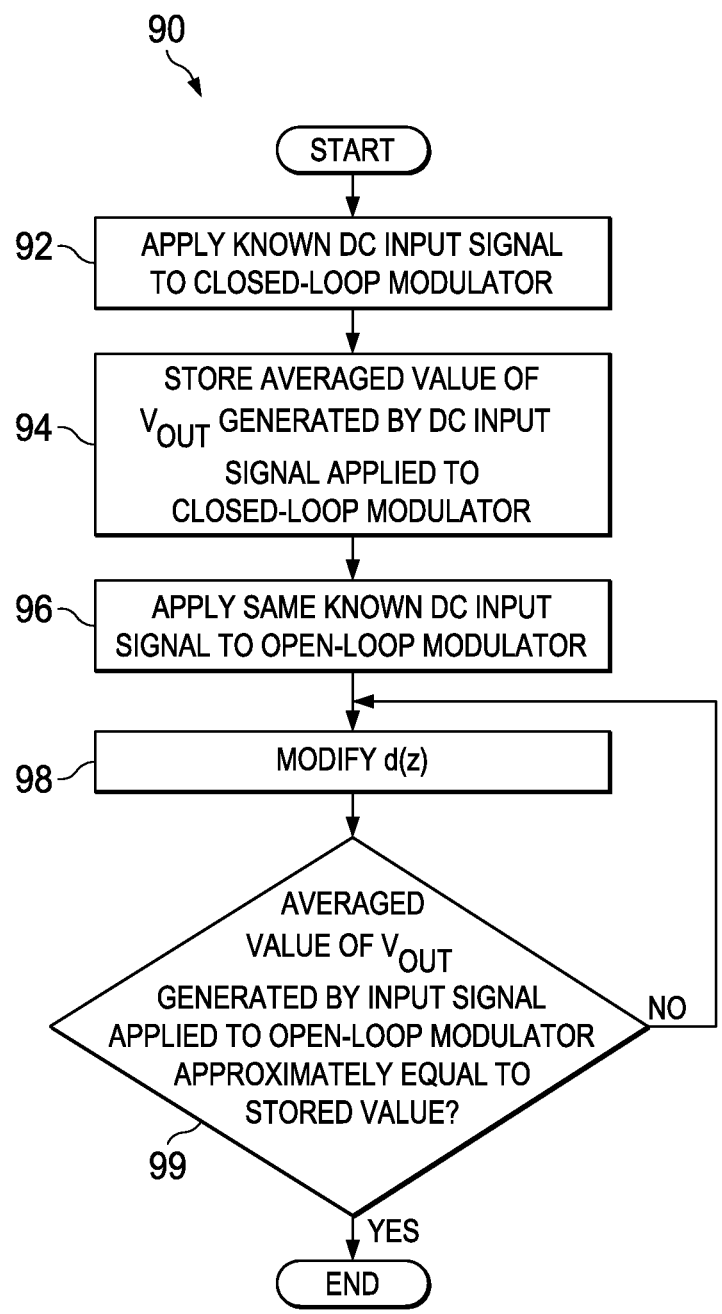
FIG. 7 illustrates a flow chart of an example method for calibrating a digital equalization filter, in accordance with embodiments of the present disclosure.

FIG. 7 illustrates a flow chart of an example method 90 for calibrating a digital equalization filter (e.g., digital equalization filter 28 or digital equalization filter 28A), in accordance with embodiments of the present disclosure. As noted above, teachings of the present disclosure may be implemented in a variety of configurations of audio ICs as shown in FIGS. 2 and 3. As such, the preferred initialization point for method 90 and the order of the steps comprising method 90 may depend on the implementation chosen. In these and other embodiments, method 90 may be implemented as firmware, software, applications, functions, libraries, or other instructions.

At step 92, microcontroller core 18 may cause a known direct current (DC) signal to be applied to a closed-loop modulator (e.g., closed-loop modulator 24 or 24A). Microcontroller core 18 may also cause an open-loop modulator (e.g., open-loop modulator 22 or 22A) in parallel with the closed-loop modulator to be inactive or muted so that it does not affect output signal $V_{OUT}$ during step 92. For example, during step 92, microcontroller core 18 may cause adder/controller 38 to mute its input for receiving the output of the open-loop modulator. At step 94, microcontroller core 18 may sense output signal $V_{OUT}$ and store an averaged value of output signal $V_{OUT}$ which is generated in response to the DC input signal applied to the closed-loop modulator.

At step 96, microcontroller core 18 may cause the same known DC signal to be applied to the open-loop modulator. Microcontroller core 18 may also cause the closed-loop modulator to be inactive or muted so that it does not affect output signal $V_{OUT}$ during step 96. For example, during step 96, microcontroller core 18 may cause adder/controller 38 to mute its input for receiving the output of the closed-loop modulator.

At step 98, microcontroller core 18 may cause modification of response d(z) of the digital equalization filter. Such modification may comprise modifying one or more filter parameters of the digital equalization filter (e.g., filter coefficients, poles, zeroes, etc.). At step 99, microcontroller core 18 may sense output signal $V_{OUT}$ generated in response to the DC signal applied to the open-loop modulator and compare an average of output signal $V_{OUT}$ generated in response to the DC signal applied to the open-loop modulator to the value stored at step 94. If the two values approximately match (e.g., within an allowable tolerance or error), the digital equalization filter may be fully calibrated and method 90 may end. Otherwise if the two values do not approximately match, method 90 may proceed again to step 98, and steps 98 and 99 may repeat until the two values approximately match.

Although FIG. 7 discloses a particular number of steps to be taken with respect to method 90, method 90 may be executed with greater or fewer steps than those depicted in FIG. 7. In addition, although FIG. 7 discloses a certain order of steps to be taken with respect to method 90, the steps comprising method 90 may be completed in any suitable order.

Method 90 may be implemented using microcontroller core 18, components thereof or any other system such as those shown in FIGS. 1-3 and operable to implement method 90. In certain embodiments, method 90 may be implemented partially or fully in software and/or firmware embodied in computer-readable media.

Although the various systems and methods described herein contemplate reduction of audio artifacts in audio paths of personal audio devices, the systems and methods herein may also apply to any other audio systems, including, without limitation, home audio systems, theaters, automotive audio systems, live performances, etc.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
    an open-loop modulator configured to receive an input signal and generate an output signal based on the input signal when the open-loop modulator is selected as a selected path;
    a closed-loop modulator configured to receive the input signal and generate a closed-loop output signal based on the input signal when the closed-loop modulator is selected as the selected path; and
    a control subsystem configured to select one of the open-loop modulator and the closed-loop modulator as the selected path based on one or more characteristics of the input signal.

2. The system of claim 1, wherein the open-loop modulator comprises a digital-input Class-D amplifier.

3. The system of claim 1, wherein the closed-loop modulator comprises an analog-input Class-D amplifier.

4. The system of claim 1, wherein the open-loop modulator and the closed-loop modulator each comprise and share:
    a switched output stage configured to drive an output load with the output signal; and
    a predriver stage configured to drive one or more predriver signals to the output stage based on the input signal, wherein the output signal is a function of the one or more predriver signals.

5. The system of claim 4, wherein the predriver generates the one or more predriver signals based on a control signal which is a function of the input signal.

6. The system of claim 5, wherein the control signal is a pulse-width modulated signal.

7. The system of claim 1, wherein the input signal is a pulse-width modulated signal.

8. The system of claim 1, wherein the control subsystem is configured to power on the closed-loop modulator for a period of time prior to switching selection of the selected path from the open-loop modulator to the closed-loop modulator.

9. The system of claim 1, wherein the control subsystem is configured to select the selected path based on a magnitude of the input signal.

10. The system of claim 1, wherein the control subsystem is configured to select the selected path based on whether a magnitude of the input signal crosses a threshold value within a period of time after a zero-crossing event of the input signal.

11. The system of claim 10, wherein the control subsystem is configured to:
    select the closed-loop modulator as the selected path when the magnitude of the input signal crosses above the threshold value within a period of time after a zero-crossing event of the input signal; and
    select the open-loop modulator as the selected path when the magnitude of the input signal remains below the threshold value within a period of time after a zero-crossing event of the input signal.

12. The system of claim 1, wherein the control subsystem is configured to select the selected path based on a slew rate of the input signal at a zero-crossing event of the input signal.

13. The system of claim 12, wherein the control subsystem is configured to:
    select the closed-loop modulator as the selected path when a magnitude of the slew rate of the input signal is greater than a threshold slew rate at the zero-crossing; and select the open-loop modulator as the selected path when the magnitude of the slew rate of the input signal is lesser than a threshold slew rate at the zero-crossing.

14. The system of claim 1, wherein the open-loop modulator includes a digital equalization filter configured to match a transfer function of the open-loop modulator to a transfer function of the closed-loop modulator.

15. The system of claim 14, wherein the digital equalization filter may be calibrated in accordance with a calibration operation to match the transfer function of the open-loop modulator to the transfer function of the closed-loop modulator.

16. The system of claim 1, wherein the closed-loop modulator comprises a low-pass filter configured to convert an error signal equal to the difference between the analog version of the input signal and a feedback signal generated by the closed-loop modulator into a filtered error signal.

17. The system of claim 16, wherein the closed-loop modulator further comprises a feedforward path that bypasses the low-pass filter and combines the input signal with the filtered error signal.

18. The system of claim 1, wherein the controller is further configured to power off the closed-loop modulator when the open-loop modulator is the selected path.

19. The system of claim 1, wherein the open-loop modulator is a digital open-loop modulator.

20. The system of claim 1, wherein the closed-loop modulator is an analog closed-loop modulator.

21. The system of claim 1, wherein the control subsystem is configured to:
select the closed-loop modulator as the selected path when the magnitude of the input signal is above a threshold value; and
select the open-loop modulator as the selected path when the magnitude of the input signal is below the threshold value.

22. A method comprising:
selecting one of an open-loop modulator and a closed-loop modulator based on one or more characteristics of an input signal;
generating an output signal based on the input signal by the open-loop modulator when the open-loop modulator is selected as a selected path; and
generating an output signal based on the input signal by the closed-loop modulator when the closed-loop modulator is selected as a selected path.

23. The method of claim 22, wherein the open-loop modulator comprises a digital-input Class-D amplifier.

24. The method of claim 22, wherein the closed-loop modulator comprises an analog-input Class-D amplifier.

25. The method of claim 22, further comprising:
driving an output load with the output signal by a switched output stage shared by the open-loop modulator and the closed-loop modulator; and
drive one or more predriver signals to the output stage based on the input signal by a predriver shared the open-loop modulator and the closed-loop modulator, wherein the output signal is a function of the one or more predriver signals.

26. The method of claim 25, further comprising generating the one or more predriver signals based on a control signal which is a function of the input signal.

27. The method of claim 26, wherein the control signal is a pulse-width modulated signal.

28. The method of claim 22, wherein the input signal is a pulse-width modulated signal.

29. The method of claim 22, further comprising powering on the closed-loop Class-D modulator for a period of time prior to switching selection of the selected path from the open-loop modulator to the closed-loop modulator.

30. The method of claim 22, further comprising selecting the selected path based on a magnitude of the input signal.

31. The method of claim 22, further comprising selecting the selected path based on whether a magnitude of the input signal crosses a threshold value within a period of time after a zero-crossing event of the input signal.

32. The method of claim 31, further comprising:
selecting the closed-loop modulator as the selected path when the magnitude of the input signal crosses above the threshold value within a period of time after a zero-crossing event of the input signal; and
selecting the open-loop modulator as the selected path when the magnitude of the input signal remains below the threshold value within a period of time after a zero-crossing event of the input signal.

33. The method of claim 22, further comprising selecting the selected path based on a slew rate of the input signal at a zero-crossing event of the input signal.

34. The method of claim 33, further comprising:
selecting the closed-loop modulator as the selected path when a magnitude of the slew rate of the input signal is greater than a threshold slew rate at the zero-crossing; and
selecting the open-loop modulator as the selected path when the magnitude of the slew rate of the input signal is lesser than a threshold slew rate at the zero-crossing.

35. The method of claim 22, further comprising applying a digital equalization filter within the open-loop modulator to match a transfer function of the open-loop modulator to a transfer function of the closed-loop modulator.

36. The method of claim 35, further comprising calibrating the digital equalization filter in accordance with a calibration operation to match the transfer function of the open-loop modulator to the transfer function of the closed-loop modulator.

37. The method of claim 22, further comprising converting by a low-pass filter within the closed-loop modulator an error signal equal to the difference between the analog version of the input signal and a feedback signal generated by the closed-loop modulator into a filtered error signal.

38. The method of claim 37, further comprising bypassing the low-pass filter with a feedforward path that combines the input signal with the filtered error signal.

39. The method of claim 22, further comprising powering off the closed-loop modulator when the open-loop modulator is the selected path.

40. The method of claim 22, wherein the open-loop modulator is a digital open-loop modulator.

41. The method of claim 22, wherein the closed-loop modulator is an analog closed-loop modulator.

42. The method of claim 22, comprising:
selecting the closed-loop modulator as the selected path when the magnitude of the input signal is above a threshold value; and
selecting the open-loop modulator as the selected path when the magnitude of the input signal is below the threshold value.

* * * * *